(12) United States Patent
Kim et al.

(10) Patent No.: US 8,156,636 B2
(45) Date of Patent: Apr. 17, 2012

(54) APPARATUS TO MANUFACTURE A SEMICONDUCTOR PACKAGE HAVING A BUFFER DISPOSED ADJACENT TO A PROCESS UNIT OF THE APPARATUS

(75) Inventors: Goon Woo Kim, Cheonan-si (KR); Whasu Sin, Cheonan-si (KR); Jae Yong Park, Cheonan-si (KR); Hwang-Bok Ryu, Asan-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 244 days.

(21) Appl. No.: 12/561,511

(22) Filed: Sep. 17, 2009

(65) Prior Publication Data

US 2010/0071854 A1 Mar. 25, 2010

(30) Foreign Application Priority Data

Sep. 19, 2008 (KR) .......................... 10-2008-0092260

(51) Int. Cl.
*B23P 19/00* (2006.01)

(52) U.S. Cl. ................. 29/740; 29/739; 29/833

(58) Field of Classification Search ............... 29/729, 29/739, 832–834, 740; 156/299, 537–539
See application file for complete search history.

(56) References Cited

U.S. PATENT DOCUMENTS

| | | | | |
|---|---|---|---|---|
| 5,342,460 | A * | 8/1994 | Hidese | 156/64 |
| 5,765,277 | A * | 6/1998 | Jin et al. | 29/743 |
| 6,544,377 | B1 * | 4/2003 | Minamitani et al. | 156/299 |
| 6,960,270 | B2 * | 11/2005 | Matsumoto et al. | 156/74 |
| 7,020,953 | B2 * | 4/2006 | Ueno et al. | 29/740 |
| 7,490,652 | B2 * | 2/2009 | Minamitani et al. | 156/537 |
| 2010/0071854 | A1 * | 3/2010 | Kim et al. | 156/538 |

FOREIGN PATENT DOCUMENTS

| | | |
|---|---|---|
| JP | 11-288980 | 10/1999 |
| JP | 2000-315856 | 11/2000 |
| JP | 2002-026074 | 1/2002 |
| JP | 2003-142518 | 5/2003 |

* cited by examiner

*Primary Examiner* — Minh Trinh
(74) *Attorney, Agent, or Firm* — Stanzione & Kim, LLP

(57) ABSTRACT

An apparatus to manufacture a semiconductor package is provided. A die attaching process and/or a wire bonding process for first and second surfaces of a lead frame are sequentially performed inside the apparatus. Thus, time required for a semiconductor packaging process decreases and yield is increased.

13 Claims, 22 Drawing Sheets

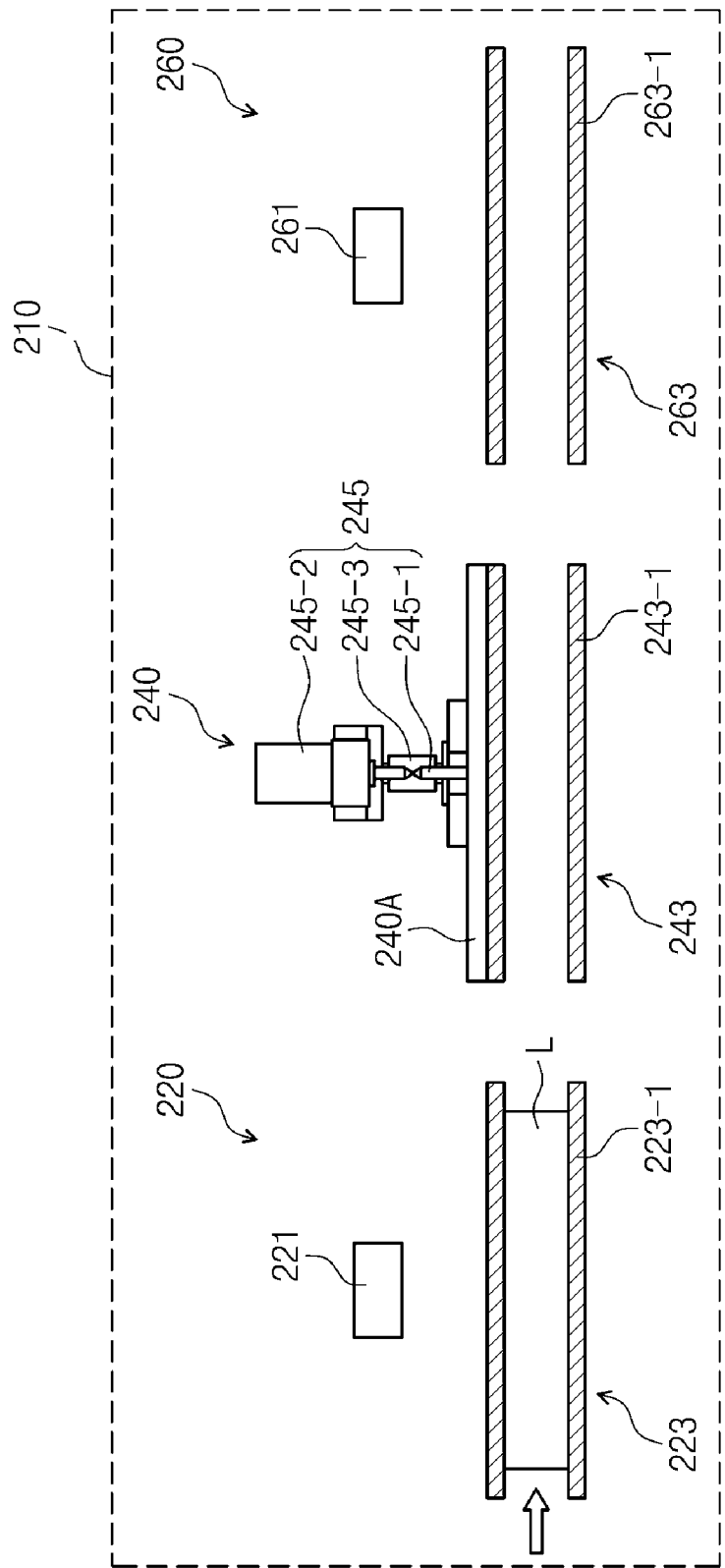

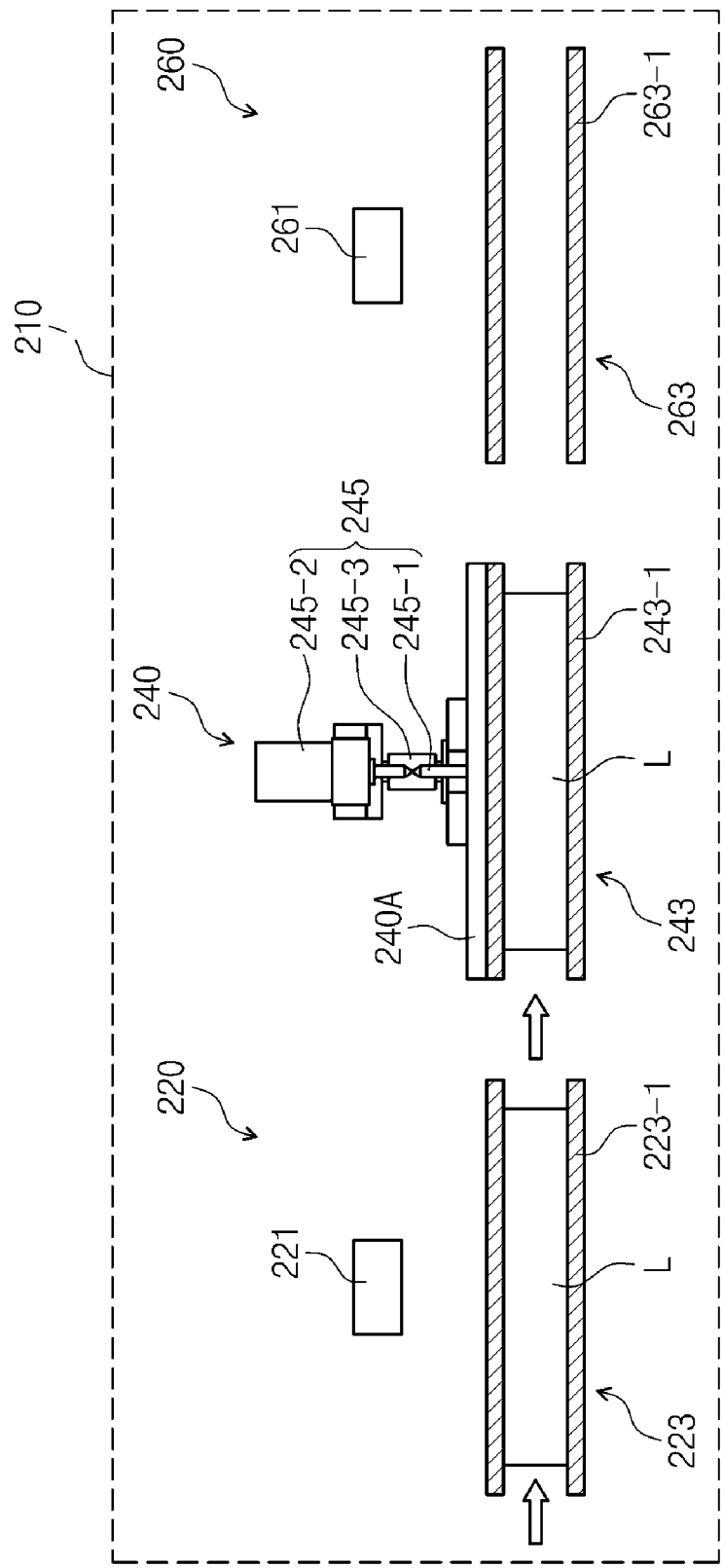

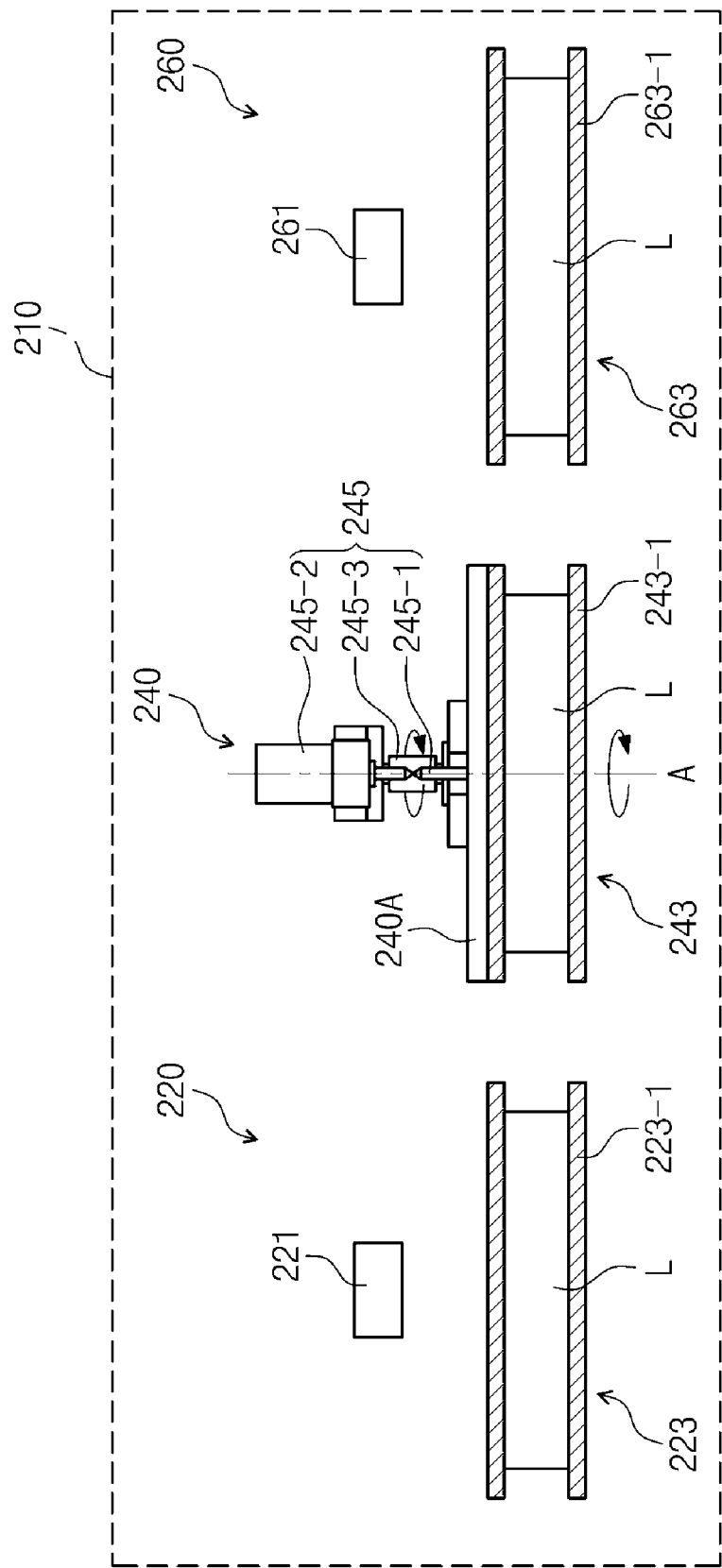

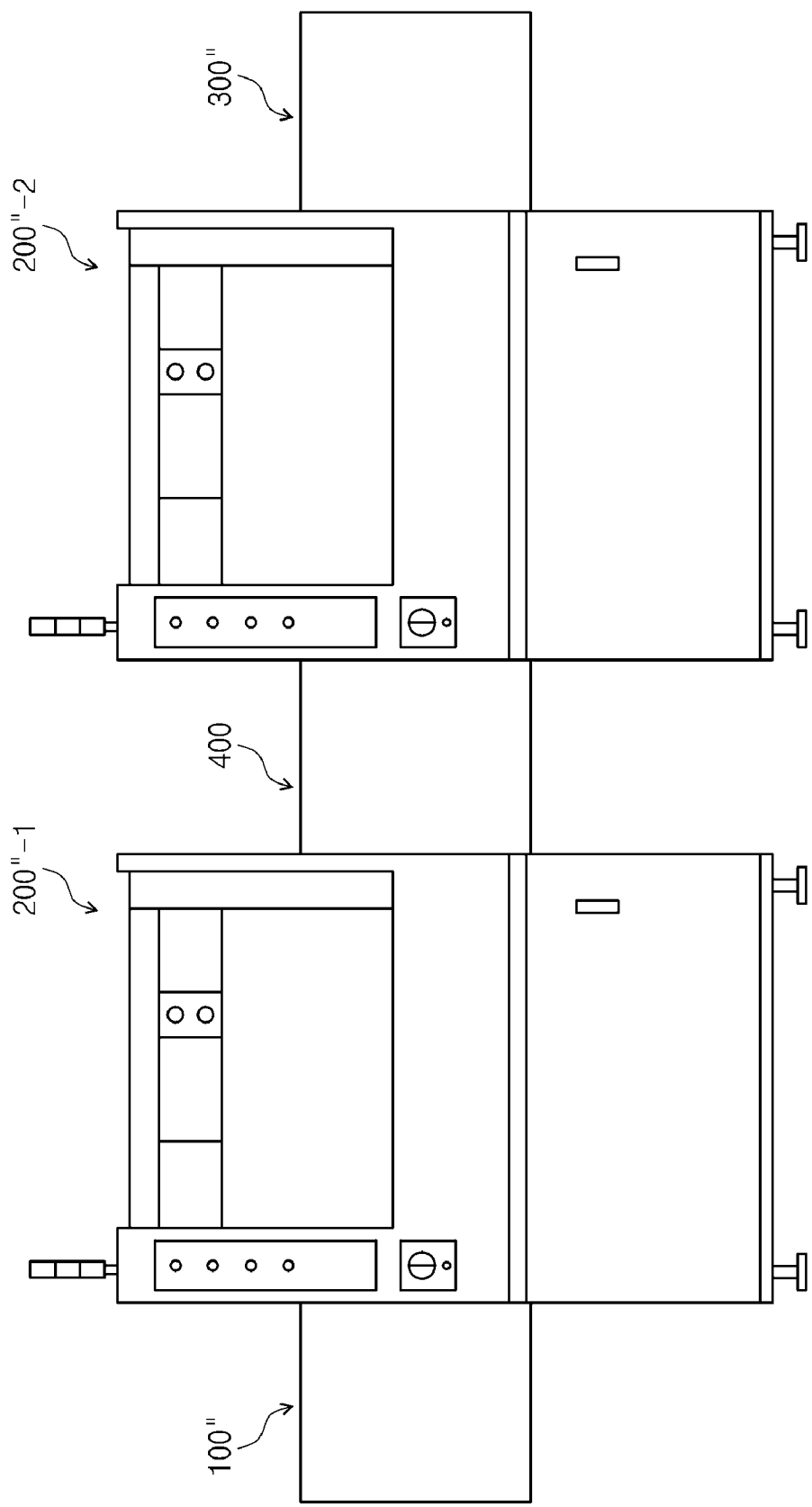

APPARATUS TO MANUFACTURE A SEMICONDUCTOR PACKAGE HAVING A BUFFER DISPOSED ADJACENT TO A PROCESS UNIT OF THE APPARATUS

CROSS-REFERENCE TO RELATED APPLICATIONS

This U.S non-provisional patent application claims priority under 35 U.S.C §119 to Korean Patent Application No. 10-2008-0092260, filed on Sep. 19, 2008, the entirety of which is herein incorporated by reference.

BACKGROUND

1. Field of the Invention

The present general inventive concept relates to apparatuses and methods of manufacturing semiconductor packages. More specifically, the present general inventive concept is directed to an apparatus and a method of manufacturing semiconductor packages by a die attaching process and/or a wire bonding process of mounting a semiconductor chip on one or more surfaces of a substrate.

2. Description of the Related Art

A typical semiconductor chip package is manufactured by means of a wafer fabricating process in which a circuit is formed on a surface of a wafer, a test process in which electrical properties of respective semiconductor chips are tested under a wafer state to determine whether the chips are good chips or bad chips, a marking process in which the bad chips are marked, a semiconductor packaging process in which the good chips are packaged into a unit semiconductor chip package product, and a test process in which it is determined whether fabricated semiconductor chip packages are good packages or bad packages by testing whether they have desired package characteristics.

With the recently availability of mobile phones and notebook computers, electronic apparatuses have been developed toward smaller, lighter, and higher precision structures. Electronic devices for use in these electronic apparatuses have been required for much smaller and much higher precision structures. In order to meet the requirement, many technologies have been applied to semiconductor devices. One of these technologies is a multi-chip packaging technology, which is used to pack a plurality of integrated circuit chips in a single package module. The multi-chip packaging technology enables a circuit board module to be smaller and lighter and enables a mounting area to be reduced.

SUMMARY

Exemplary embodiments of the present general inventive concept provide an apparatus and a method of manufacturing semiconductor packages by a die attaching process and/or a wire bonding process of mounting a semiconductor chip on a plurality of surfaces of a substrate. Additional features and utilities of the present general inventive concept will be set forth in part in the description which follows and, in part, will be obvious from the description, or may be learned by practice of the general inventive concept.

Exemplary embodiments of the present general inventive concept provide an apparatus for manufacturing a semiconductor package. In an exemplary embodiment, the apparatus may include a first process unit to perform a semiconductor package manufacturing process on a first surface of a substrate, a reversing unit to reverse an orientation of the substrate such that a second surface of the substrate faces in a first direction, and a second process unit to perform a semiconductor package manufacturing process on the second surface of the substrate that faces in the first direction. The first process unit, the reversing unit, and the second process unit are provided inside an equipment housing.

Exemplary embodiments of the present general inventive concept also provide an apparatus that may include a die attaching part to attach a semiconductor chip to a substrate, a buffer part disposed adjacent to the die attaching part that includes a space to hold the substrate transferred from the die attaching part, and a wire bonding part disposed adjacent to the buffer part to electrically connect the semiconductor chips attached to the substrate transferred from the buffer part to terminals of the substrate. The die attaching part includes first and second die attaching units to attach the semiconductor chip to a surface of the substrate that faces in a first direction. The wire bonding part includes first and second wire bonding units to electrically connect the semiconductor chips attached to the surface of the substrate that faces in the first direction to terminals of the substrate. The reversing units to reverse an orientation of the substrate are disposed between the first and second die attaching units and between the first and second wire bonding units, respectively.

Exemplary embodiments of the present general inventive concept also provide a method of manufacturing a semiconductor package where semiconductor chips are mounted on first and second surfaces of a substrate. The method may include performing a semiconductor package manufacturing process on the first surface of the substrate, reversing an orientation of the substrate such that the second surface of the substrate faces in a first direction, and performing a semiconductor package manufacturing process on the second surface of the substrate that faces in the first direction. The semiconductor package manufacturing processes and the reversion of the orientation of the substrate are sequentially performed inside a first equipment housing.

The method may further include performing a first wire bonding process on the first surface of the substrate that faces in the first direction when the die attaching process is completed, reversing an orientation of the substrate, and performing a second wire bonding process on the second surface of the substrate that faces in the first direction. The first wire bonding process, the reversion of the orientation of the substrate, and the second wire bonding process are sequentially performed inside a second equipment housing disposed adjacent to the first equipment housing.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIGS. 6A through 6F illustrate operation states of an apparatus to manufacture semiconductor packages according to exemplary embodiments of the present general inventive concept;

FIG. 12 illustrates an apparatus to manufacture semiconductor packages according to exemplary embodiments of the present general inventive concept;

DETAILED DESCRIPTION OF THE EMBODIMENTS

Figure 1:
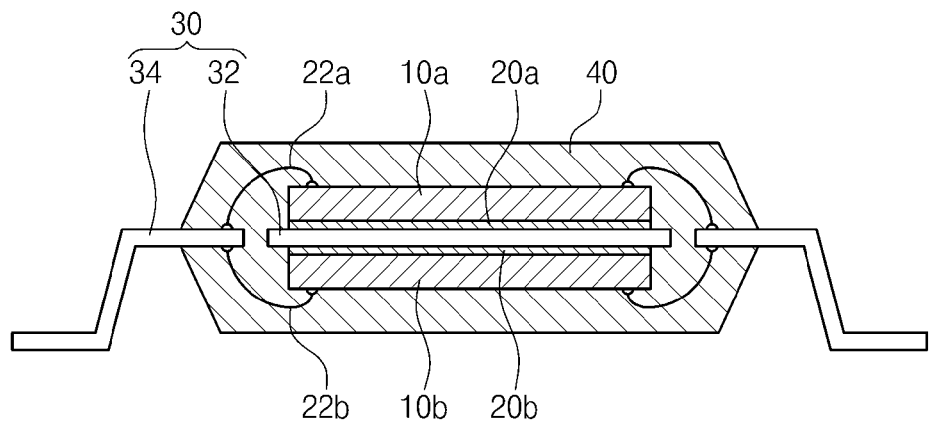
FIG. 1 illustrates a structure of a conventional dual die package (DDP)

The present general inventive concept will now be described more fully hereinafter with reference to the accompanying drawings, in which embodiments of the present general inventive concept are illustrated and described. The present general inventive concept, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, parts and elements are exaggerated for clarity. Like numbers refer to like elements throughout.

Multi-chip packaging techniques are packaging techniques to manufacture a single package having a plurality of semiconductor chips. The multi-chip packaging techniques adopt a double-sided stacked multi-chip packaging technique to mount a plurality of semiconductor chips stacked on both surfaces of a lead frame. A dual die package (DDP) or a quad die package (QDP) are double-sided stacked multi-chip packages. The DDP may be used to stack two semiconductor chips, with one chip on each surface of a lead frame. The QDP is a semiconductor package that may be used to stack four semiconductor chips, with two chips on each surface of a lead frame.

FIG. 1 illustrates a conventional DDP structure.

Referring to FIG. 1, a first semiconductor chip 10a and a second semiconductor chip 10b are attached on an upper surface and a lower surface of a die pad 32 of a lead frame 30 with a first bonding layer 20a and a second bonding layer 20b, respectively. The first semiconductor chip 10a is electrically connected to a lead finger 34 of the lead frame 30 via a first wire bond 22a, and the second semiconductor chip 10b is electrically connected to the lead finger 34 of the lead frame 30 via a second wire bond 22b. The first and second semiconductor chips 10a and 10b, the first and second wire bonds 22a and 22b, and their bonding portions may be sealed by a plastic molding 40.

Figure 2:
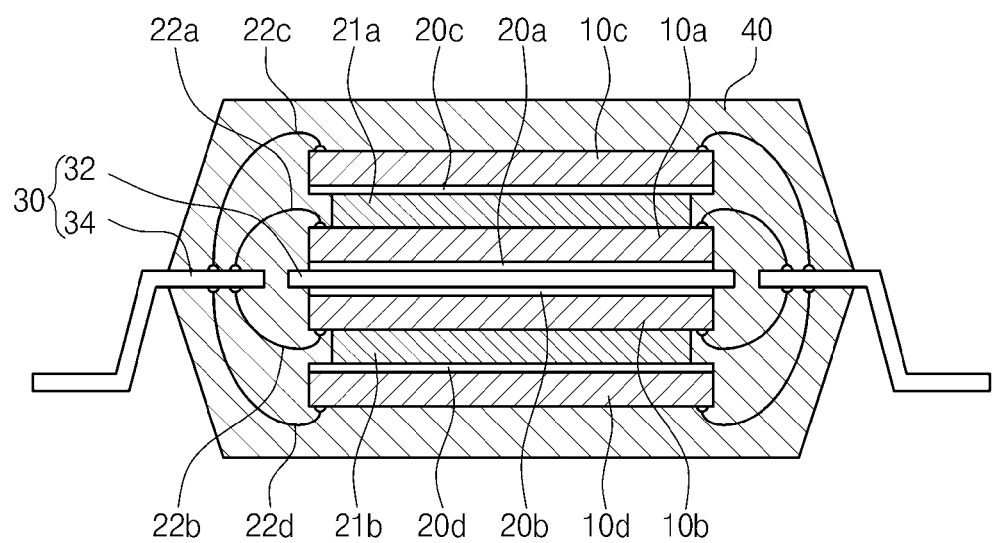
FIG. 2 illustrates a structure of a conventional quad die package (QDP)

FIG. 2 illustrates a conventional QDP structure.

Referring to FIG. 2, a first semiconductor chip 10a and a second semiconductor chip 10b are attached on an upper surface and a lower surface of a die pad 32 of a lead frame 30 using a first bonding layer 20a and a second bonding layer 20b, respectively. The first semiconductor chip 10a is electrically connected to a lead finger 34 of the lead frame 30 via a first wire bond 22a, and the second semiconductor chip 10b is electrically connected to the lead finger 34 of the lead frame 30 via a second wire bond 22b.

A spacer 21a is loaded on the upper surface of the first semiconductor chip 10a. A third semiconductor chip 10c is attached on the upper surface of the spacer 21a using a third bonding layer 20c. A spacer 21b is disposed on a lower surface of the second semiconductor chip 10b. A fourth semiconductor chip 10d is attached on a lower surface 21b of the spacer 21b using a fourth bonding layer 20d. The third semiconductor chip 10c is electrically connected to the lead finger 34 of the lead frame 30 via a third wire bond 22c. The fourth semiconductor chip 10d is electrically connected to the lead finger 34 of the lead frame 30 via a fourth wire bond 22d. The first to fourth semiconductor chips 10a, 10b, 10c, and 10d, the first to fourth wire bonds 22a, 22b, 22c, and 22d, and their bonding portions are sealed by a plastic molding 40 such as epoxy molding resin.

An apparatus to manufacture semiconductor packages according to the present general inventive concept improves upon an apparatus for manufacturing DDP and QDP type double-sided stacked multi-chip packages, which will now be described below in detail.

Figure 3:
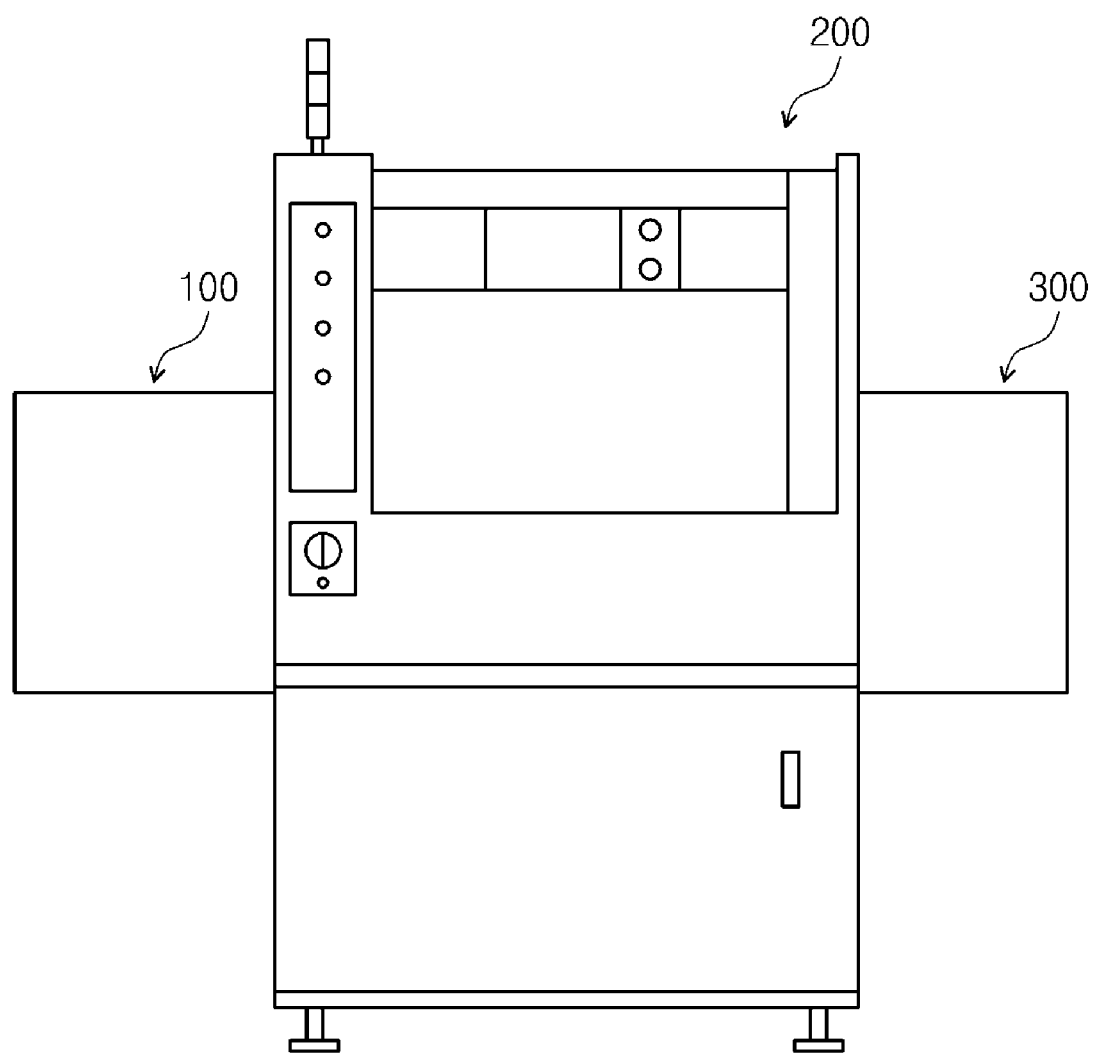
FIG. 3 illustrates an apparatus to manufacture semiconductor packages according to exemplary embodiments of the present general inventive concept.

FIG. 3 illustrates an apparatus to manufacture semiconductor packages according to exemplary embodiments of the present general inventive concept. The apparatus is a die attaching apparatus where a semiconductor chip is attached to a die pad.

As illustrated in FIG. 3, the apparatus (i.e., die attaching apparatus) includes a loading unit 100, a body 200, and an unloading unit 300. The loading unit 100 is disposed at one side of the body 200, and the unloading unit 300 is disposed at the other side thereof to be symmetrical to the loading unit 100. Although a symmetrical arrangement of the loading unit 100 and the unloading unit 300 is illustrated, the loading unit 100 and unloading unit 300 may be disposed so as to be asymmetrical. The loading unit 100 may provide a lead frame to the body 200, where a plurality of semiconductor chips are disposed on the lead frame in a double-sided stack multi-chip packing arrangement. That is, the body 200 is configured to perform a die attaching process to attach a semiconductor chip to the lead frame. The unloading unit 300 unloads the lead frame of a die attaching process from the body 200.

Figure 4:
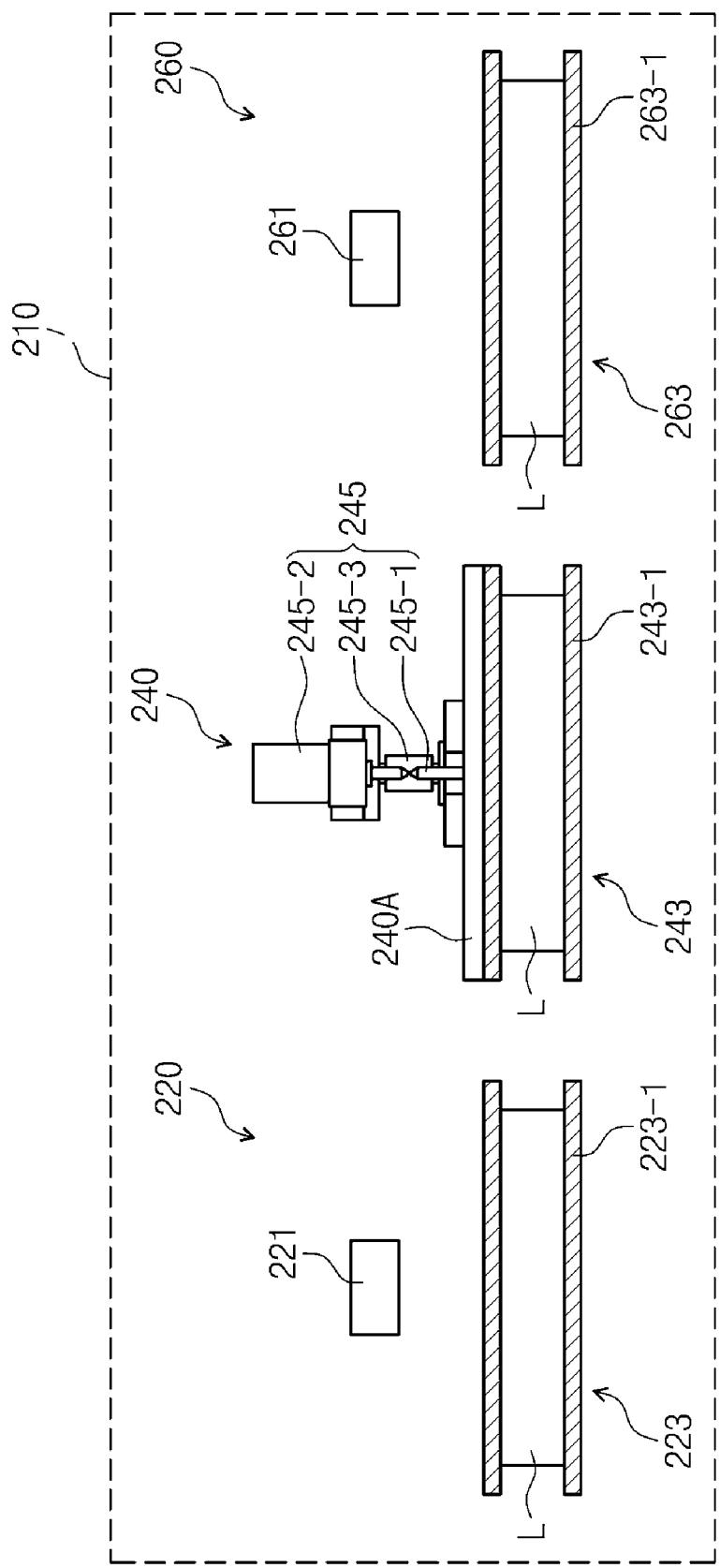
FIG. 4 illustrates an internal configuration of the body of the apparatus of FIG. 3.

FIG. 4 illustrates an exemplary internal configuration of the apparatus of FIG. 3.

As illustrated in FIG. 4, the body 200 includes a first die attaching unit 220, a reversing unit 240, and a second die attaching unit 260, which may be disposed in an equipment housing 210. For example, the reversing unit 240 may be disposed at a central portion inside the housing 210, and the first and second die attaching units 220 and 260 may be disposed at a first end (e.g., a front end) and a second end (e.g., a back end) of the reversing unit 240 in a row, respectively. The first die attaching unit 220 may perform a die attaching process for a first surface (e.g., an upper surface) of a lead frame L. The reversing unit 240 reverses the lead frame L such that a first portion (e.g., a lower portion) of the lead frame L to face in a first direction (e.g., to face up). The second die attaching unit 260 may perform a die attaching process for the first portion of lead frame L facing in the first direction (e.g., face-up lower surface of the lead frame L).

Figure 5:
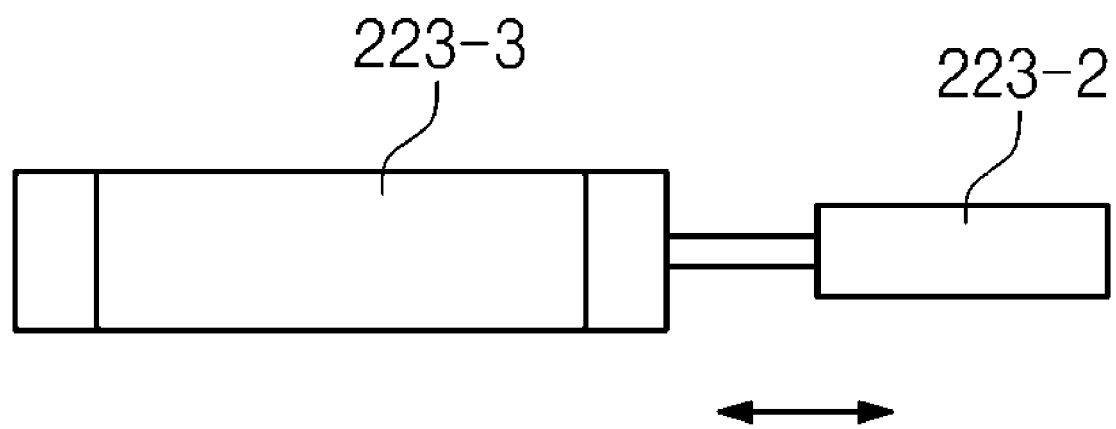
FIG. 5 illustrates a pusher provided for the body of the apparatus of FIG. 4.

The first die attaching unit 220 includes a die bonding module 221 and a transfer member 223 to support the lead frame L. The transfer member 223 includes a guide rail 223-1 to support the lead frame L and to guide a linear transfer of the lead frame L. The guide rail 223-1 is aligned to extend in a transfer direction of the lead frame L. The guide rail 223-1 supports an edge of a side of the lead frame L facing a longitudinal direction of the guide rail 223-1, among four sides of the lead frame L. The lead frame L supported by the guide rail 223-1 is transferred to the reversing unit 240 by a pusher 223-2 illustrated in FIG. 5. A cylinder 223-3 is disposed to provide a linear driving force, and is connected to the pusher 223-2. The pusher 223-2 pushes the lead frame L to the reversing unit 240 with at least the driving force of the cylinder 223-3. The die bonding module 221 is disposed at one side of the guide rail 223-2 and attaches a semiconductor chip to the first surface (e.g., the face-up surface) of the lead frame L.

The reversing unit 240 includes a coupler 240A, a transfer member 243 and a rotation driving member 245. The transfer member 243 may have same configuration as the transfer member 223 of the first die attaching unit 220 and will not be explained in further detail.

A guide rail 243-1 is aligned to extend in a transfer direction of the lead frame L. The guide rail 243-1 supports the edge of a side of the lead frame L facing a longitudinal direction of the guide rail 243-1, among four sides of the lead frame L. The pusher 223-2 and the cylinder 223-3 illustrated in FIG. 5 may also be disposed at the reversing unit 240.

The reversing unit 240 rotates the guide rail 243-1 coupled to the coupler 240A of the reversing unit 240 to reverse first and second surfaces (e.g., top/bottom surfaces or face-up/face-down surfaces) of the lead frame L supported by the guide rail 243-1. As described in detail below, the reversing unit 240 rotates the guide rail 243-1 about an A axis illustrated in FIG. 4.

Figure 6B:
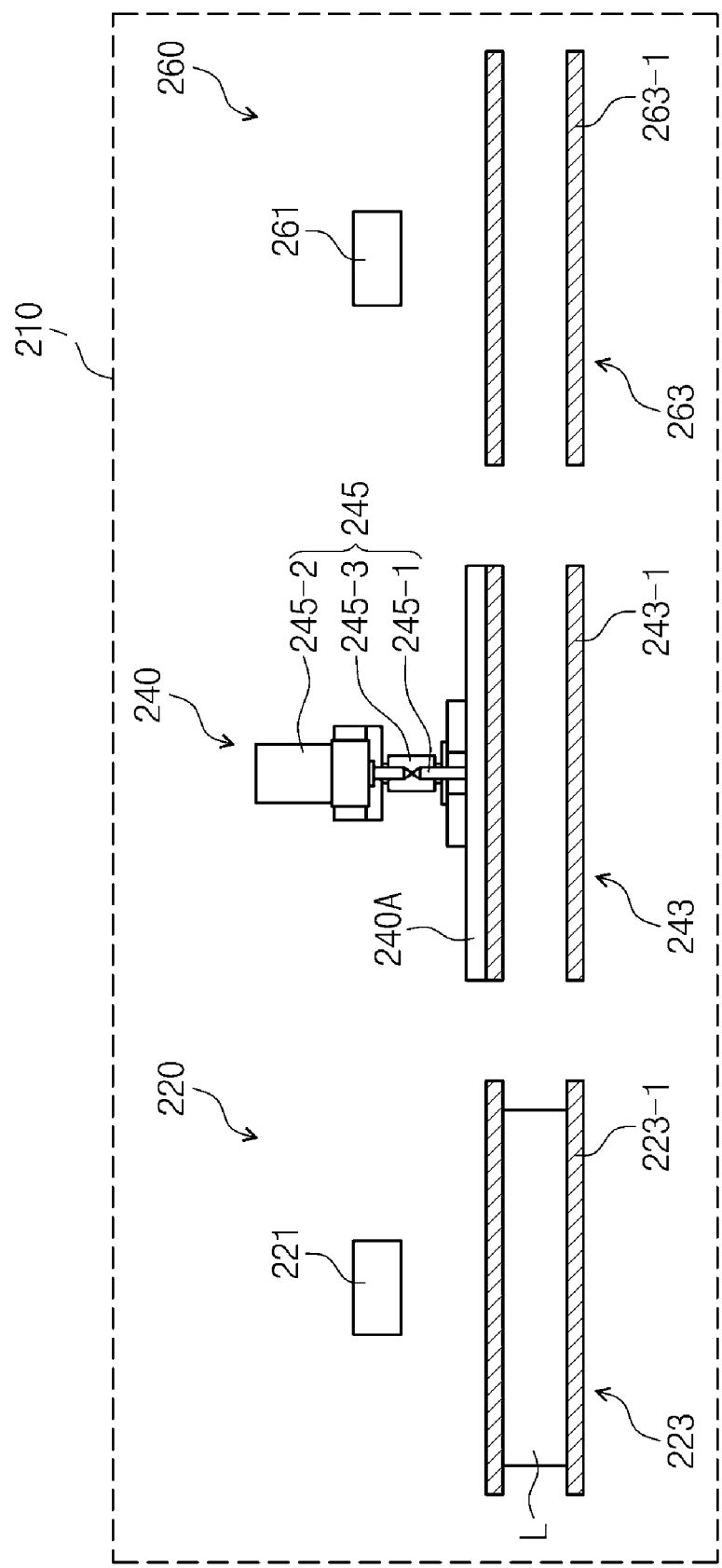
Figure 6D:
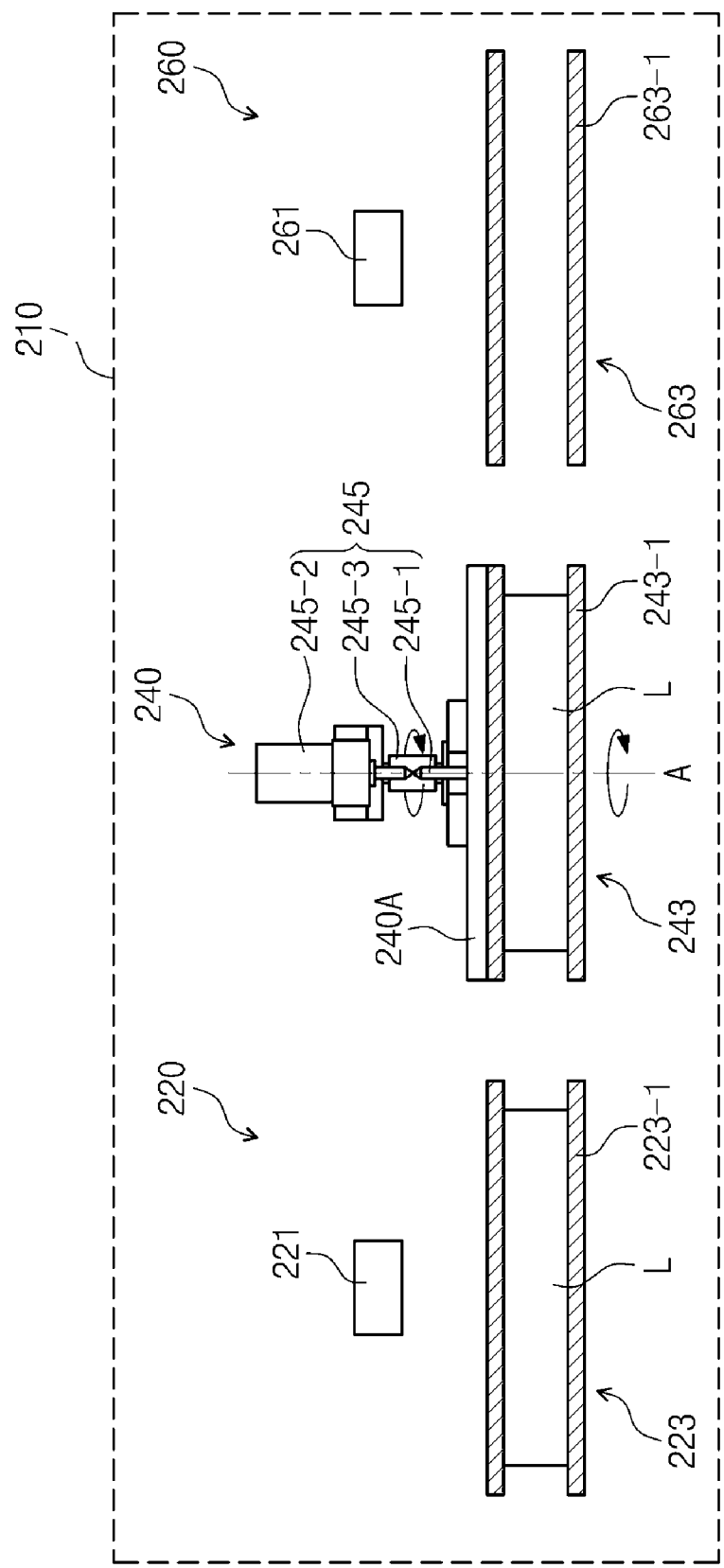
Figure 6E:
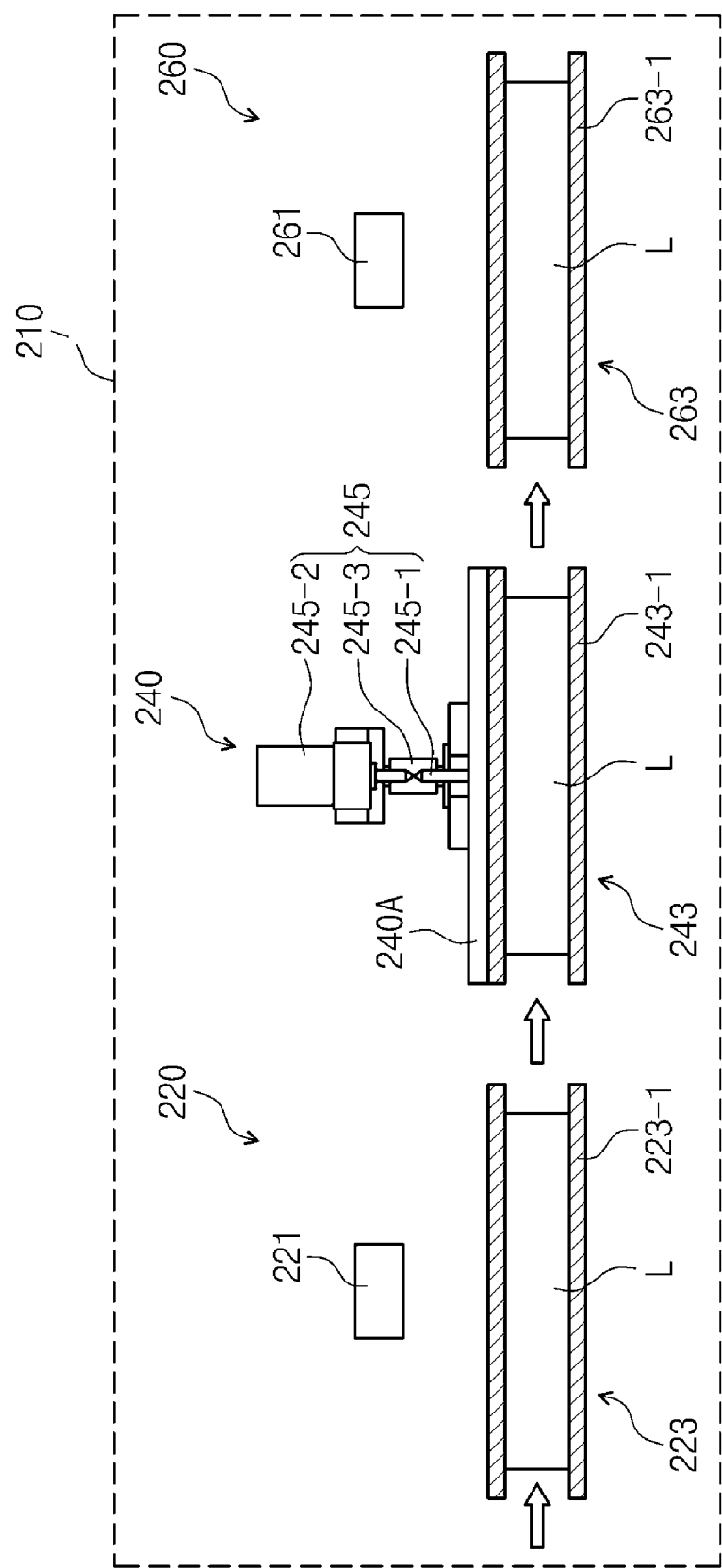

The rotation driving member 245 includes a rotation shaft 245-1 coupled with the guide rail 243-1. The rotation driving member 245 may rotate the guide rail 243-1 about the axis A in a clockwise or counterclockwise direction, as illustrated in FIG. 6D. The rotation shaft 245-1 may be connected to a side surface of the guide rail 243-1 with coupler 240A, perpendicular to the longitudinal direction of the guide rail 243-1. The rotation shaft 245-1 is coupled with a driving motor 245-2 by a coupling member 245-3, and the driving motor 245-2 provides a rotation force to the rotation shaft 245-1.

Although it is described above that the rotation shaft 245-1 is connected to a side surface of the guide rail 243-1, perpendicular to the longitudinal direction of the guide rail 243-1, the rotation shaft 245-1 may be connected to at least one end of the guide rail 243-1 in line with the longitudinal direction of the guide rail 243-1. The reversing unit 240 may rotate the guide rail 243-1 about the axis A. Although FIG. 4 illustrates that the guide rail 243-1 rotates about axis A in a clockwise direction, the guide rail 243-1 may alternatively rotate about axis A in a counterclockwise direction.

The second die attaching unit 260 may include a die bonding module 261 and a transfer member 263. The die bonding module 261 and the transfer member 263 have the same configurations as the die bonding module 221 and the transfer member 223 of the first die attaching unit 220, respectively and will not be explained in further detail. A guide rail 263-1 is aligned to extend in a transfer direction of the lead frame L. The guide rail 263-1 supports the edge of a side of the lead frame L facing a longitudinal direction of the guide rail 263-1, among four sides of the lead frame L. The pusher 223-2 and the cylinder 223-3 may also be disposed at the second die attaching unit 260.

A die attaching process with an apparatus to manufacture semiconductor packages (die attaching apparatus) according to the exemplary embodiments of the present general inventive concept as at least discussed above will now be described below in detail.

FIGS. 6A through 6F illustrate operation states of an apparatus to manufacture semiconductor packages according to the present general inventive concept, and FIGS. 7A through 7D illustrate proceeding states of a die attaching process of a dual die package (DDP).

Figure 7A:
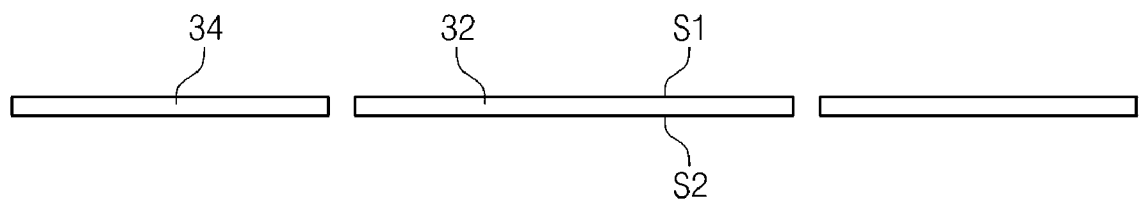
FIGS. 7A through 7D illustrate proceeding states of a die attaching process of a dual die package (DDP) according to exemplary embodiments of the present general inventive concept.

Referring to FIGS. 3, 5, 6A through 6G, and 7A through 7D, a lead frame L is supplied from a loading unit 100 to a first die attaching unit 220 disposed in a body 200. The lead frame L is moved to a process position on a guide rail 223-1 by a pusher 223-2. The movement of the lead frame L is guided by the guide rail 223-1 (see FIG. 6A). FIG. 6A illustrates the lead frame L loaded on the guide rail 223-1 of a first attaching unit 220. In FIG. 7A, S1 and S2 represent a top surface and a bottom surface of a die pad 32 of the lead frame L, respectively.

A first bonding layer 20a is formed and/or disposed on the top surface S1 of the die pad 32 of the lead frame L. A die bonding module 221 disposes and/or positions a first semiconductor chip 10a in contact with the first bonding layer 20a and applies bonding load to attach the first semiconductor chip 10a to a first surface (e.g., the top surface S1) of the die pad 32 of the lead frame L (see FIGS. 6B and 7B).

The lead frame L with the first semiconductor chip 10a attached to the top surface S1 of the die pad 32 is transferred to a guide rail 243-1 of a reversing unit 240 by the pusher 223-2. A surface S1 of the lead frame L faces in a first direction (e.g., a top surface of the lead frame faces up). A lead frame L having no attached semiconductor chip is supplied to the guide rail 223-1 (FIG. 6C) by the loading unit 100.

The lead frame L transferred to the reversing unit 240 is reversed such that the surface S1 (e.g., a top surface) of the lead frame L faces in a second direction (e.g., faces down direction) and the surface S2 (e.g., a bottom surface) thereof faces up. A rotation driving force of a driving motor 245-2 is transmitted to a rotation shaft 245-1, and the guide rail 243-1 coupled with the rotation shaft 245-1 is rotated about the A axis in either a clockwise or counterclockwise direction to reverse the lead frame L. The first die attaching unit 220 performs a die attaching process to attach a semiconductor chip to the first surface (e.g., top surface) of a die pad (see FIGS. 6D and 7C).

The reversed lead frame L (e.g., where the first surface an second surface are reversed to face in different directions than previously oriented; that is, where a top surface and a bottom surface are exchanged) is transferred to a second die attaching unit 260 from the reversing unit 240, and the lead frame L with the semiconductor chip attached on the top surface of the die pad is transferred to the reversing unit 240 from the first die attaching unit 220. The pusher 223-2 may transfer the lead frame L between the first die attaching unit 220 and the reversing unit 240 and transferring the lead frame L between the reversing unit 240 and the second die attaching unit 260. A lead frame L having no attached semiconductor chip is provided to the guide rail 223-1 of the first die attaching unit 220 (see FIG. 6E).

Figure 7B:
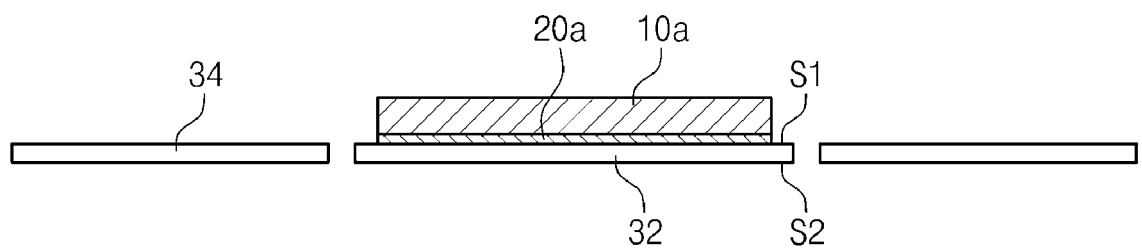
Figure 7C:
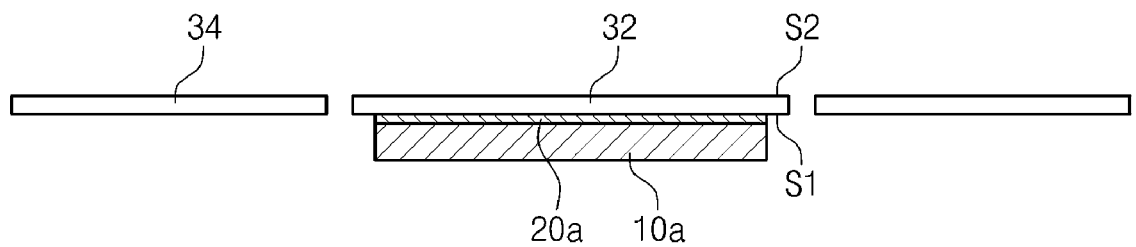
Figure 7D:
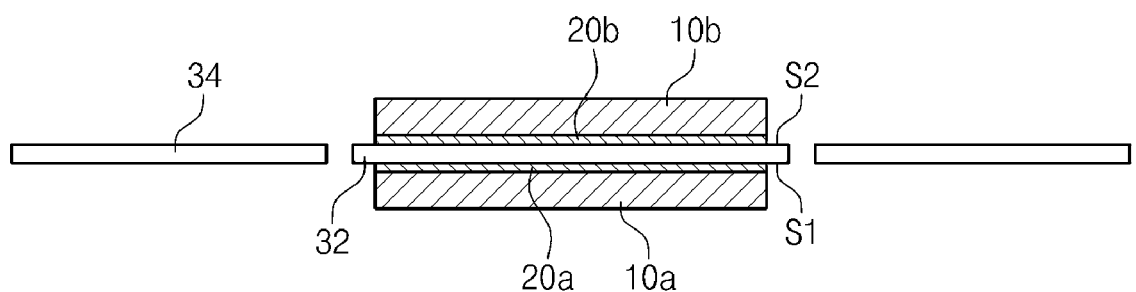

FIGS. 6B and 7B illustrate a die attachment process of the first die attaching unit 220. The reversing unit 240 reverses a lead frame L about the A axis, as illustrated in FIG. 6D. A second bonding layer 20b is formed on the surface S2 (e.g., the bottom surface) of the die pad 32 of the lead frame L transferred to the second die attaching unit 260. A die bonding module 261 disposes and/or positions a second semiconductor chip 10b to come in contact with the second bonding layer 20b and applies bonding load to attach the second semiconductor chip 10a to the bottom surface S2 of the die pad 32 of the lead frame L (see FIGS. 6F and 7D).

After completing the die attaching process for the top and bottom surfaces S1 and S2 of the die pad 32, the lead frame L is transferred to an unloading unit 300. A die attaching process for a plurality of lead frames may be performed through the repetition of the foregoing operations.

Figure 8:
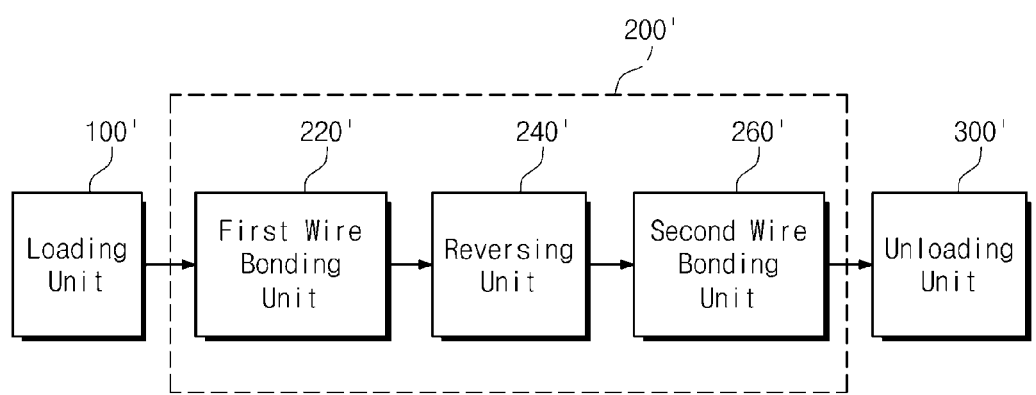
FIG. 8 illustrates an apparatus to manufacture semiconductor packages according to exemplary embodiments of the present general inventive concept.
Figure 9:
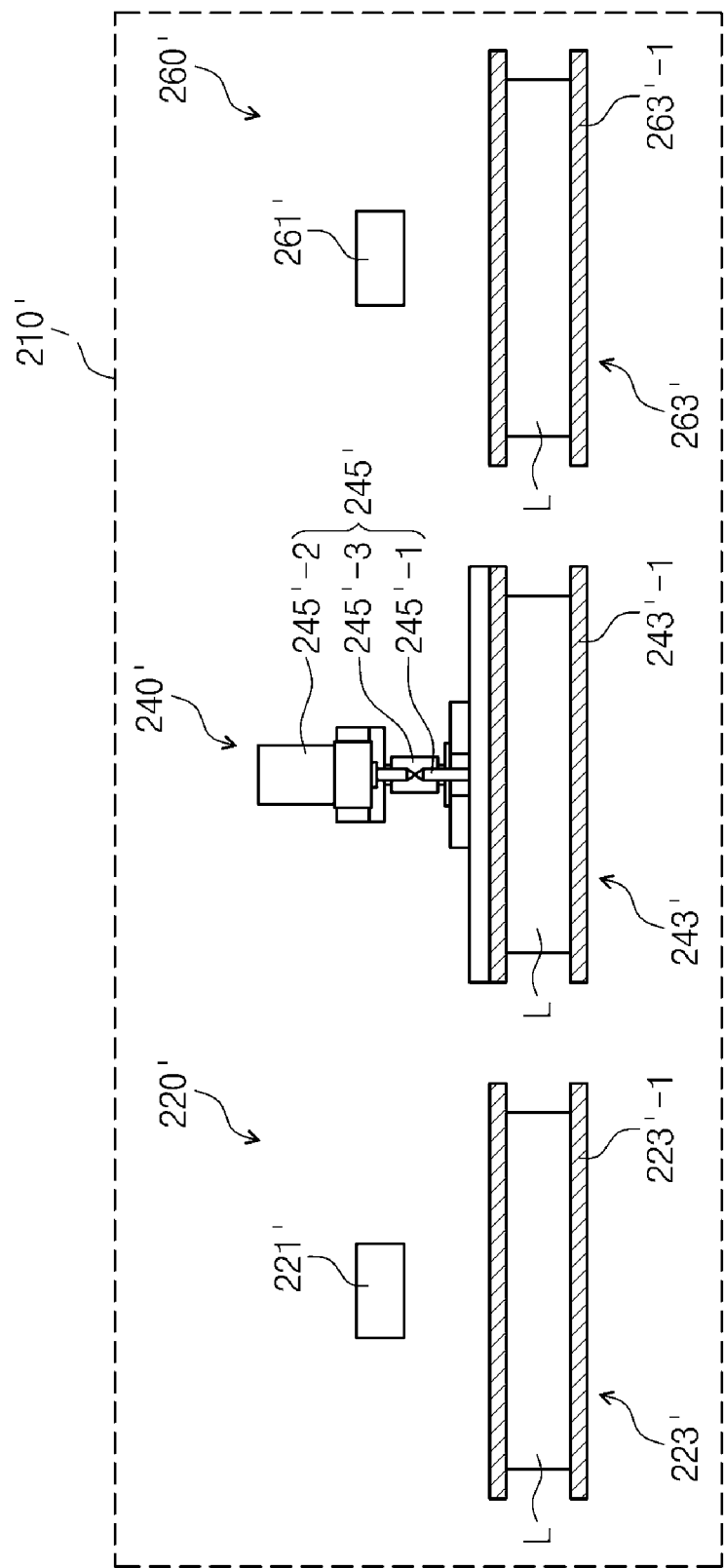
FIG. 9 illustrates an internal configuration of the body of the apparatus of FIG. 8.

FIG. 8 illustrates an apparatus to manufacture semiconductor packages according to exemplary embodiments of the present general inventive concept, and FIG. 9 illustrates an internal configuration of the body 200 of the apparatus shown in FIG. 8.

FIGS. 8 and 9 illustrate an apparatus to manufacture semiconductor packages according to exemplary embodiments of the present general inventive concept. The apparatus may be a wire bonding apparatus to electrically connect a semiconductor chip attached to a die pad of a lead frame to a lead finger of the lead frame.

The apparatus to manufacture semiconductor packages (wire bonding apparatus) includes a loading unit 100', a body 200', and an unloading unit 300'. The loading unit 100' may be disposed at one side of the body 200', and the unloading unit 300' may be disposed at the other side thereof. The loading unit 100' and the unloading unit 300' may be symmetrical about the body 200'. Although a symmetrical arrangement of the loading unit 100' and the loading unit 300' is illustrated, the loading unit 100' and loading unit 300' may be disposed so as to be asymmetrical. The loading unit 100' provides a lead frame with a semiconductor chip attached to first and second surfaces (e.g., top and bottom surfaces) of a die pad to the body 200'. The body 200' performs a wire bonding process to electrically connect a semiconductor chip to the lead finger of the lead frame. The unloading unit 300' unloads the lead frame subjected to the wire bonding process from the body 200'.

The body 200' includes a first wire bonding unit 220', a reversing unit 240', and a second wire bonding unit 260', which may be disposed in an equipment housing 210'. For example, the reversing unit 240' may be disposed at a position (e.g., an inner central portion) inside the housing 210', and the first and second wire bonding units 220' and 260' may be disposed at first and second ends (e.g., front and back ends) of the reversing unit 240' in a row. The first wire bonding unit 220' performs a wire bonding process for a first surface (e.g., top surface) of a lead frame L. The reversing unit 240' reverses the lead frame L such that the second surface (e.g., bottom surfaces) of the lead frame L faces in a first direction (e.g., faces up). The second wire bonding unit 260' performs a wire bonding process for the second surface facing in a first direction (e.g., face-up bottom surface) of the lead frame L.

A first wire bonding unit 220' includes a wire bonding module 221' and a transfer member 223'. The transfer member 223' includes a guide rail 223'-1 to support the lead frame L and to guide a linear transfer of the lead frame L. The guide rail 223'-1 is aligned to extend in a transfer direction of the lead frame L and supports the edge of a side facing a longitudinal direction of the guide rail 223'-1 among four sides of the guide rail 223'-1. The lead frame L supported by the guide rail 223'-1 is transferred to the reversing unit 240' by a pusher (223-2 in FIG. 5). The wire bonding module 221' is disposed at one side of the guide rail 223'-1 and electrically connects a semiconductor chip attached to a die pad of the lead frame L to a lead finger of the lead frame L by means of wire bond.

The reversing unit 240' may have the same configuration as the reversing unit 240 of the apparatus illustrated in FIG. 4, and the second wire bonding unit 260' may have the same configuration as the first wire bonding unit 220'. Therefore, the configurations of the reversing unit 240' and the second wire bonding unit 260' will not be described, as reversing unit 240 and 220' are described above.

The apparatus illustrated in FIG. 9 may include a transfer member 243', a guide rail 243'-1, a rotation driving member 245', a rotation shaft 245'-1, a driving motor 245'-2, a coupling member 245'-3, a wire bonding module 261', a transfer member 263', and a guide rail 263'-1.

A wire bonding process with the above-described apparatus to manufacture semiconductor packages (wire bonding apparatus) according to exemplary embodiments of the present general inventive concept will now be described below in detail. The operation of the apparatus to manufacture semiconductor packages (wire bonding apparatus) according to exemplary embodiments of the present general inventive concept are similar to those of the apparatus illustrated in FIGS. 6A through 6F (hereinafter referred to as "die attaching apparatus"). For clarity, the difference between the operations and the above-described operations in connection with FIGS. 6A through 6F will now be described.

FIGS. 10A through 10E illustrate proceeding states of a wire bonding process of a dual die package (DDP).

Referring to FIGS. 8, 9, and 10A through 10E, a lead frame L subjected to a die attaching process is provided from a loading unit 100' to a first wire bonding unit 220' disposed in a body 200'. The die attaching process may be performed with the above-described apparatus to manufacture semiconductor packages (die attaching apparatus). A first semiconductor chip 10a may be attached to a surface S1 (e.g., a top surface) of a die pad 32 of the lead frame L, and a second chip 10b may be attached to a surface S2 (e.g., a bottom surface) of the die pad 32 of the lead frame L (see FIG. 10A).

Figure 10A:
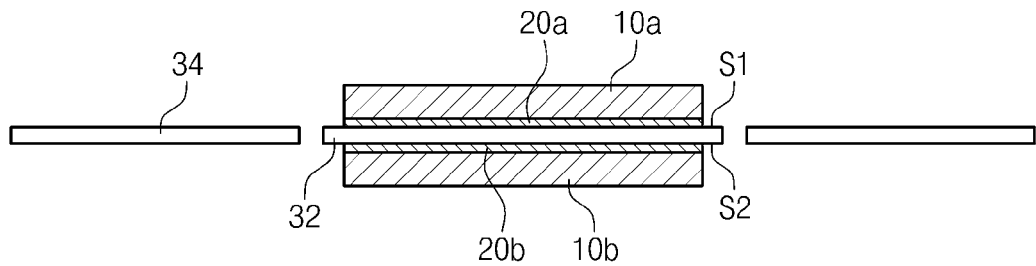
FIGS. 10A through 10E illustrate proceeding states of a wire bonding process of a dual die package (DDP) according to exemplary embodiments of the present general inventive concept.
Figure 10B:
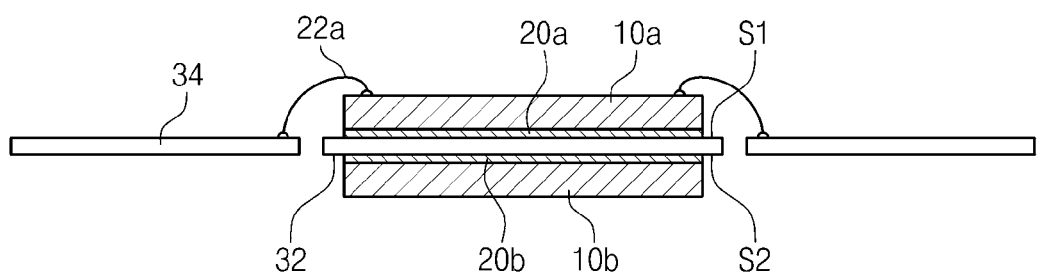
Figure 10C:
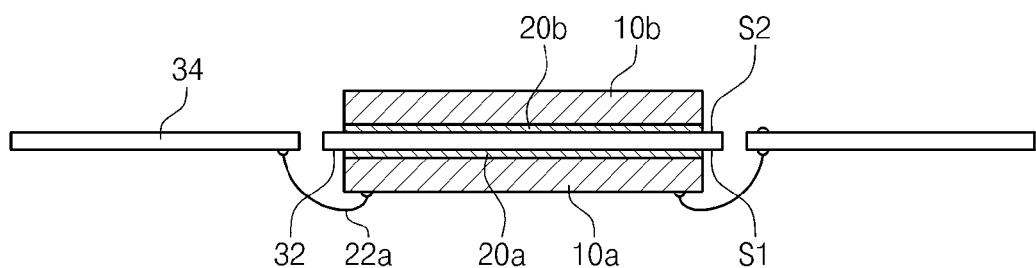
Figure 10D:
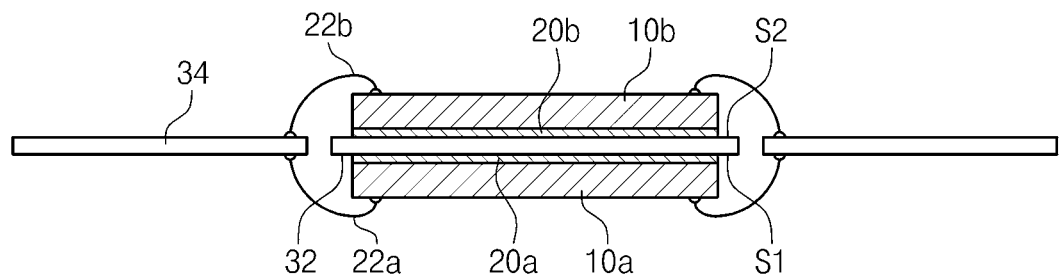
Figure 10E:
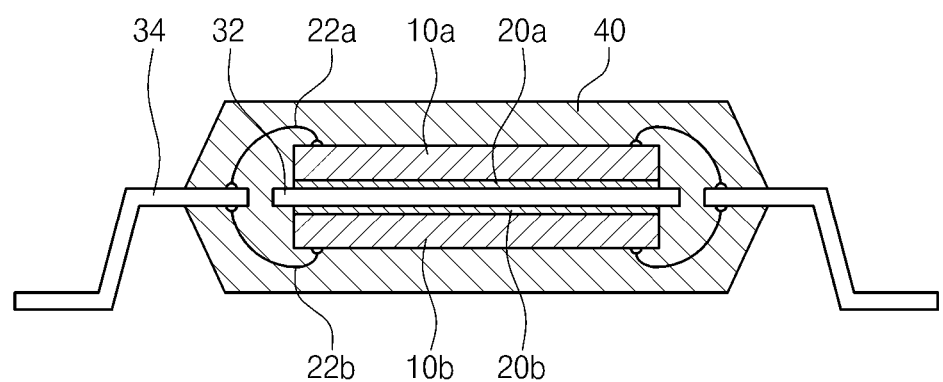

A wire bonding module 221' electrically connects the first semiconductor chip 10a attached to the top surface S1 of the die pad 32 to a lead finger 34 of the lead frame L with a first wire bond 22a (see FIG. 10B).

The lead frame L is transferred to a guide rail 243'-1 of a reversing unit 240'. A rotation driving member 245' of the reversing unit 240' rotates the guide rail 243'-1, and the lead frame L is reversed by the rotation of the guide rail 243'-1. That is, the surface S1 (e.g., the top surface) of the die pad 32 of the lead frame L1 faces in a direction (e.g., faces down), and the surface S2 of the die pad 32 of the lead frame L1 faces in another direction (e.g., faces up) (see FIG. 10C).

The reversed lead frame L is transferred to a guide rail 263'-1 of a second wire bonding unit 260'. The second wire bonding unit 260' electrically connects a second semiconductor chip 10b attached to the bottom surface S2 of the die pad 32 to a lead finger 34 of the lead frame L with a second wire bond 22b (see FIG. 10D).

After completing a wire bonding process for the top surface S1 and the bottom surface S2 of the die pad 32, the lead frame L is transferred to an unloading unit 300'. The first and second semiconductor chips 10a and 10b, the first and second wire bonds 22a and 22b, and their bonding portions are sealed with a plastic mold 40 such as epoxy molding resin, being manufactured into a dual die package (DDP) (see FIG. 10E).

A wire bonding process of a dual die package (DDP) performed using an apparatus for manufacturing semiconductor packages (wire bonding apparatus) according to another embodiment of the present general inventive concept has been described. Now, a wire bonding process of a quad die package (QDP) performed using the apparatus for manufacturing semiconductor packages (wire boding apparatus) according to the present general inventive concept will be described below in detail.

FIGS. 11A through 11E illustrate proceeding states of a wire bonding process of a quad die package (QDP).

Referring to FIGS. 8, 9, and 11A through 11E, a lead frame L is provided from a loading unit 100' to a first wire bonding unit 220' inside a body 200'. A first semiconductor chip 10a and a third semiconductor chip 10c are stacked to be attached to a surface S1 (e.g., a top surface) of a die pad 32 of the lead frame L, and a second semiconductor chip 10b and a fourth semiconductor chip 10d are stacked to be attached to a surface S2 (e.g., a bottom surface) of the die pad 32 of the lead frame L. The first semiconductor chip 10a is electrically connected to a lead finger 34 of the lead frame L by a first wire bond 22a, and the second semiconductor chip 10 is electrically connected to the lead finger 34 of the lead frame L by a second wire bond 22b (see FIG. 11A).

Figure 11A:
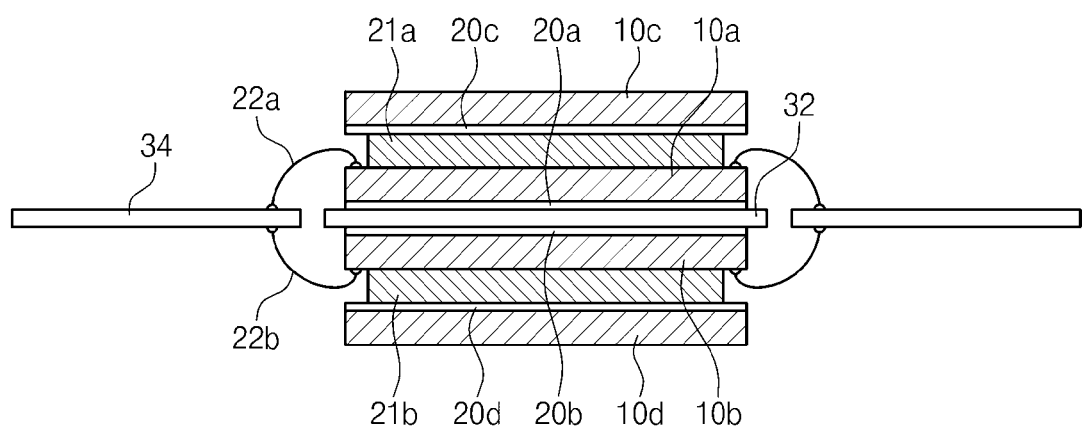
FIGS. 11A through 11E illustrate proceeding states of a wire bonding process of a quad die package (QDP) according to exemplary embodiments of the present general inventive concept.

The lead frame illustrated in FIG. 11A is a structure formed by sequentially performing a die attaching process of the first and second semiconductor chips 10a and 10b, a wire bonding process of the first and second semiconductor chips 10a and 10b, and a die attaching process of the third and fourth semiconductor chips 10c and 10d. The die attaching process may be performed using the above-described apparatus to manufacture semiconductor packages (die attaching apparatus) according to exemplary embodiments of the present general inventive concept, and the wire bonding process may be performed with the above-described apparatus to manufacture semiconductor packages (wire bonding apparatus) according to exemplary embodiments of the present general inventive concept (see FIG. 11A).

Figure 11B:
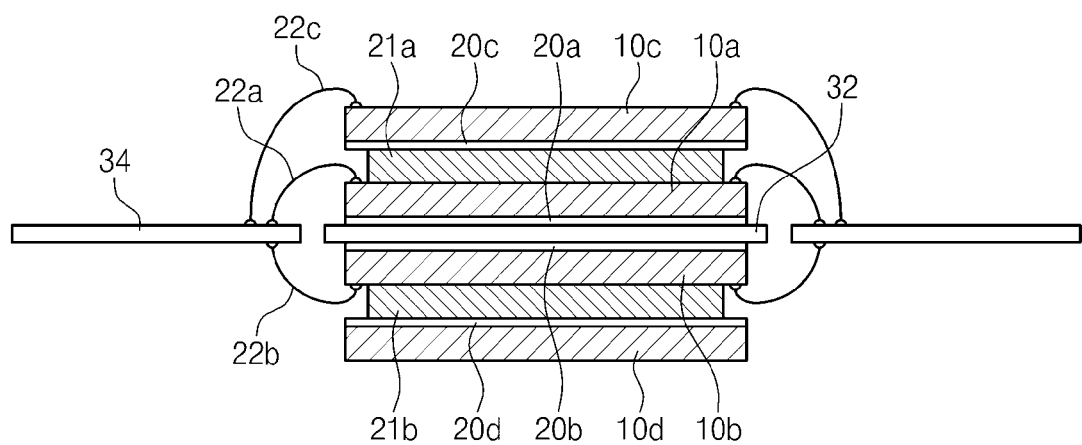
Figure 11C:
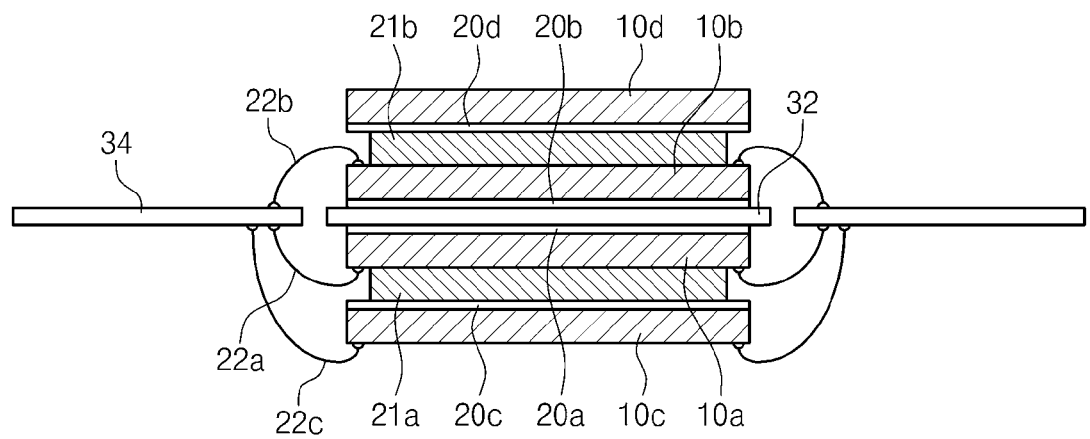
Figure 11D:
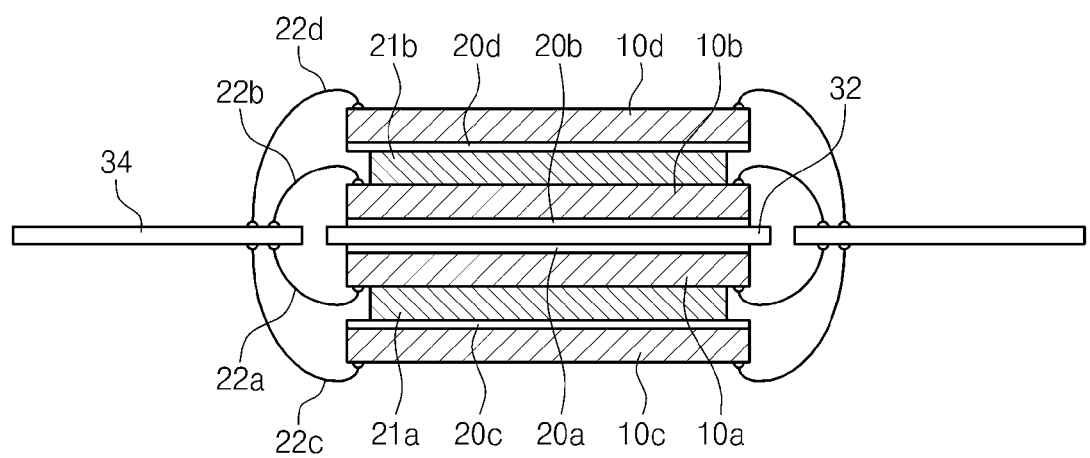
Figure 11E:
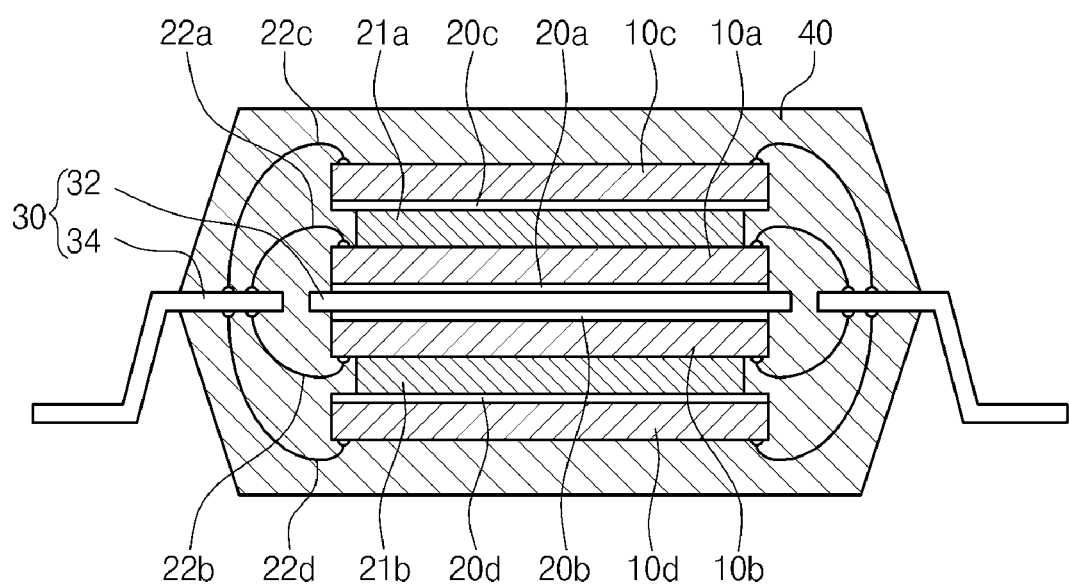

A wire bonding module 221' of a first wire bonding unit 220' electrically connects the third semiconductor chip 10c to the lead finger 34 of the lead frame L with a third wire bond 22c (see FIG. 11B).

The lead frame L is transferred to a guide rail 243'-1 of a reversing unit 240'. A rotation driving member 245' of the reversing unit 240' rotates the guide rail 243'-1, and the lead frame L is reversed by the rotation of the guide rail 243'-1. That is, a surface S1 (e.g., a top surface) of the die pad 32 of the lead frame L faces in a direction (e.g., faces down), and a surface S2 (e.g., a bottom surface) of the die pad 32 of the lead frame L faces in another direction (e.g., faces up) (see FIG. 11C).

The reversed lead frame L is transferred to a guide rail 263'-1 of a second wire bonding unit 260'. A wire bonding module 261' of the second wire bonding unit 260' electrically connects a fourth semiconductor chip 10d to the lead finger 34 of the lead frame L by using a fourth wire bond 22d (see FIG. 11D).

The lead frame L is transferred to the unloading unit 300' when the third and fourth semiconductor chips 10c and 10d are wire bound. The first to fourth semiconductor chips 10a, 10b, 10c, and 10d, the first to fourth wire bonds 22a, 22b, 22c, and 22d, and their boding portions are sealed by a plastic mold 40 such as epoxy molding resin that may be manufactured into a quad die package (QDP) (see FIG. 11E).

FIG. 12 illustrates an apparatus to manufacture semiconductor packages according to exemplary embodiments of the present general inventive concept. Referring to FIG. 12, the apparatus is an in-line type semiconductor package manufacturing apparatus with a die attaching unit and a bonding unit disposed in a row.

The apparatus includes a loading part 100", a die attaching part 200"-1, a buffer part 400, a wire bonding part 200"-2, and an unloading part 300", which may be disposed sequentially adjacent to each other, or that may be disposed in any other suitable arrangement. The loading part 100" provides a lead frame to a die attaching part 200"-1. The die attaching part 200"-1 may sequentially perform a die attaching process for a first surface (e.g., top surface) and a second surface (e.g., a bottom surface) of the lead frame. The buffer part 400 may have a space where the lead frame transferred to the wire bonding part 200"-2 from the die attaching part 200"-1 stands by and transfers the lead frame to the wire boding part 200"-2. The wire bonding part 200"-2 sequentially performs a wire bonding process for the first and second surfaces (e.g., top and bottom surfaces) of the lead frame. The unloading part 300" unloads the wire bonding processed lead frame from the wire bonding part 200"-2.

Figure 13:
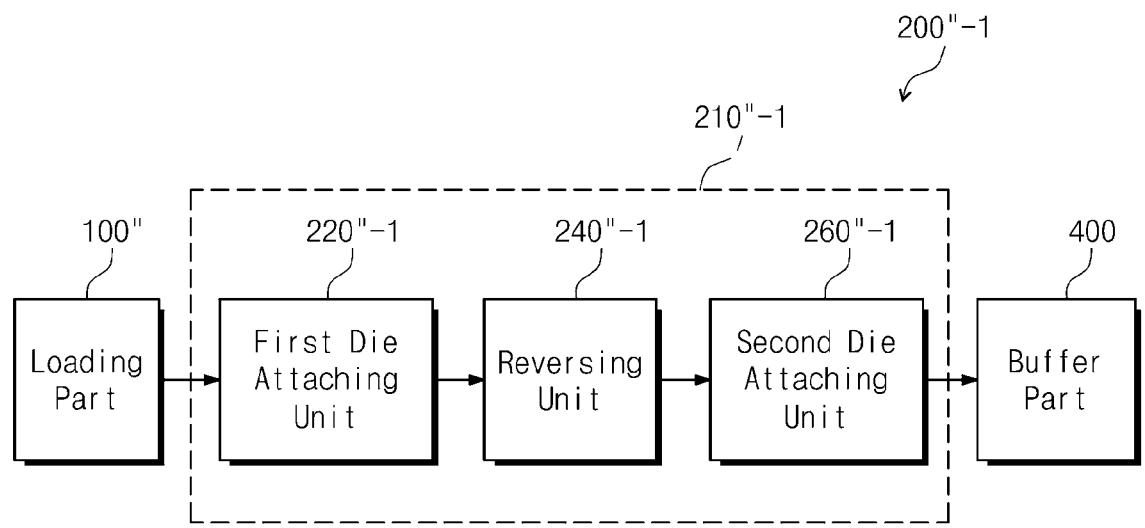
FIG. 13 is a block diagram illustrating the die attaching part of FIG. 12.

FIG. 13 is a block diagram illustrating an exemplary configuration of the die attaching part illustrated in FIG. 12.

Referring to FIG. 13, a die attaching part 200"-1 includes a first die attaching part 220"-1, a reversing part 240"-1, and a second die attaching part 260"-1, which may be disposed in an equipment housing 210"-1. For example, the reversing part 240"-1 may be disposed at a portion (e.g., an inner central portion) of the housing 210"-1, and the first and second die attaching parts 220"-1 and 260"-1 may be disposed at a first end and a second end (e.g., the front end and the back end) of the reversing part 240"-1 in a row, respectively.

The first die attaching unit 220"-1 may have the same configuration as the first die attaching unit 220 illustrated in FIG. 4, and the reversing unit 240"-1 may have the same configuration as the reversing unit 240 illustrated in FIG. 4. In addition, the second die attaching unit 260"-1 may have the same configuration as the second die attaching unit 260 illustrated in FIG. 4. Thus, the first and second die attaching units 220"-1 and 260"-1 and the reversing unit 260"-1 will not be described in further detail, as the first die attaching unit 220 and the reversing unit 240 are described herein.

The first die attaching unit 220"-1 performs a die attaching process to a first surface (e.g., top surface) of a lead frame L. The reversing unit 240"-1 reverses the lead frame L such that a second surface (e.g., bottom surface) of the lead frame L faces a first direction (e.g., faces up). The second die attaching unit 260"-1 performs a die attaching process to the second surface that faces in the first direction (e.g., the face-up bottom surface) of the lead frame L. The operation of the die attaching part 200"-1 may be similar to that of the apparatus to manufacture semiconductor packages (die attaching apparatus) illustrated in FIGS. 6A to 6F. The operations of the die attaching process may be similar to the process described above with reference to FIGS. 7A to 7D.

Figure 14:
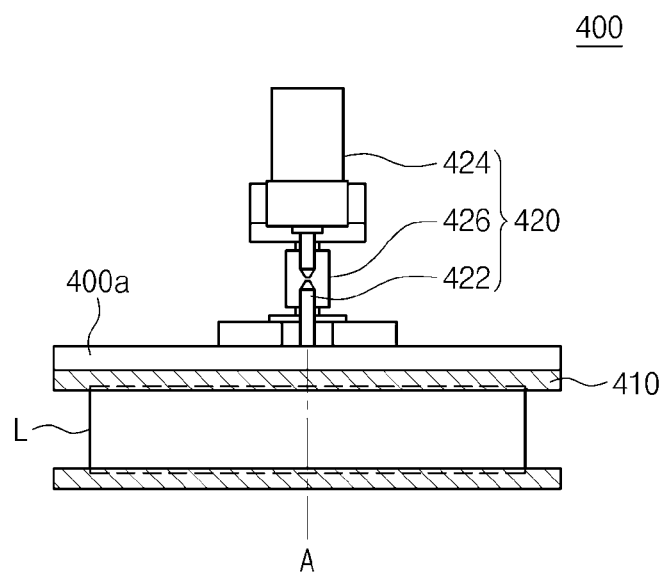
FIG. 14 illustrates a buffer part of FIG. 12.

FIG. 14 illustrates the configuration of a buffer part 400 of FIG. 12. The buffer part 400 includes coupler 400a to couple a guide rail 410 to the buffer part, where the guide rail 410 is aligned to extend in a transfer direction of a lead frame L. The guide rail 410 supports two sides facing a longitudinal direction of the guide rail 410, among four sides of the lead frame L. A driving member 420 includes a rotation shaft 422, a driving motor 424, and a coupling member 426. The rotation shaft 422 is coupled with one side surface of the guide rail 410 to be perpendicular to the longitudinal direction of the guide rail 410. The rotation shaft 422 is connected to a driving motor 424 by a coupling member 426. The driving motor 424 supplies rotation force to reverse the orientation of the first and second surfaces (e.g., top/bottom surfaces) of the lead frame L supported by the guide rail 410. That is, the driving member 420 rotates the lead frame L about the A axis in either a clockwise or counterclockwise direction.

The guide rail 410 of the buffer part 400 may include a space where the lead frame L transferred to a wire bonding part 200"-2 from a die attaching part 200"-1 stands by. The lead frame L supported by the guide rail 410 is transferred to the wire bonding part 200"-2 by a pusher (not illustrated).

The lead frame L may be transferred to the wire bonding part 200"-2 when a first surface or second surface of the lead frame L faces a first direction (e.g., when a bottom or top surface of the lead frame L faces up). Since the second surface (e.g., bottom surface) of the lead frame L transferred from the die attaching part 200"-1 faces in a first direction (e.g., faces up), the guide rail 410 supporting the lead frame L rotates 180 degrees on the rotation shaft 422 to transfer the lead frame L whose first surface faces in the first direction (e.g., top surface faces up) to the wire bonding part 200"-2.

Figure 15:
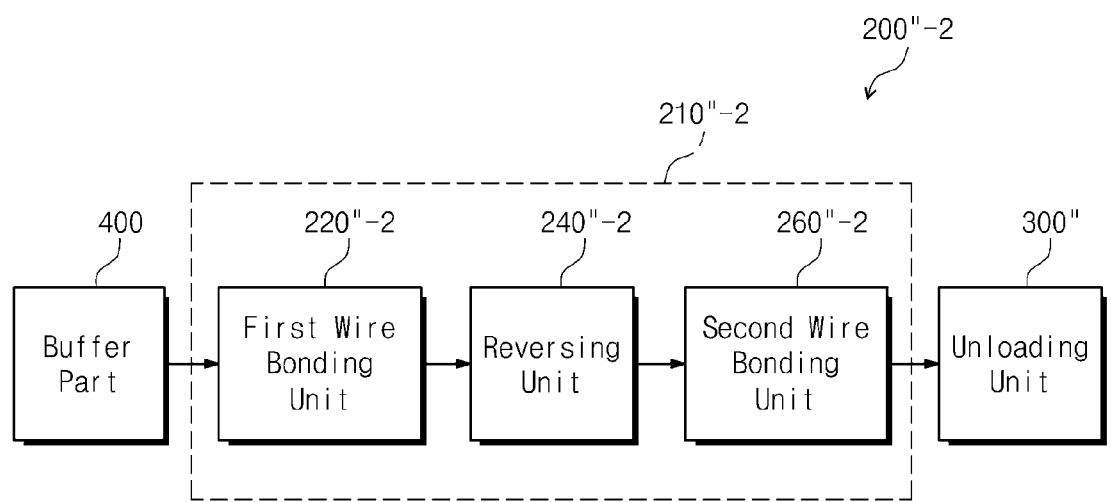
FIG. 15 is a block diagram illustrating the wire bonding part of FIG. 12.

FIG. 15 is a block diagram illustrating an exemplary configuration of a wire bonding part of FIG. 12.

Referring to FIG. 15, the wire bonding part 200"-2 includes a first wire bonding unit 220"-2, a reversing unit 240"-2, and a second wire bonding unit 260"-2, which may be disposed in an equipment housing 210"-2. For example, the reversing unit 240"-2 may be disposed at a portion (e.g., an inner central portion) of the housing 210"-2, and the first and second wire bonding units 220"-2 and 260"-2 may be disposed at a first end and a second end (e.g., the front end and the back end) of the reversing unit 240"-2 in a row, respectively.

The first wire bonding unit 220"-2 may have a similar configuration as the first wire bonding unit 220 illustrated in FIG. 9, and the reversing unit 240"-2 may have a similar configuration as the reversing unit 240 illustrated in FIG. 9. In addition, the second wire bonding unit 260"-2 has the same configuration as the second wire bonding unit 260 illustrated in FIG. 9. Therefore, the first and second wire bonding unit 220"-2 and 260"-2 and the reversing unit 204"-2 will not be described in further detail, as the first wire bonding unit 220 and the reversing unit 240 are described in detail above.

The first wire bonding unit 220"-2 performs a wire bonding process for a first surface (e.g., top surface) of a lead frame L. The reversing unit 240"-2 reverses the lead frame L such that a second surface (e.g., bottom surface) of the lead frame L faces in a first direction (e.g., faces up). The second wire bonding unit 260"-2 performs a wire bonding process for the second surface facing in the first direction (e.g., face-up bottom surface) of the lead frame L. The operation of the wire bonding part 200"-2 is similar to the apparatus for manufacturing semiconductor packages (die attaching apparatus) illustrated in FIGS. 6A to 6F. The wire bonding process may be similar to the process described with reference to FIGS. 10A to 10D.

In a conventional apparatus for manufacturing semiconductor packages, a die attaching process or a wire bonding process for a top surface or a bottom surface of a lead frame is individually performed with separate equipment. Thus, process time increases and a semiconductor chip can be damaged which reduces yield when the chip is transferred between the separate pieces of equipment. However, in an apparatus for manufacturing semiconductor packages according to the exemplary embodiments of the present general inventive concept as discussed herein, a die attaching process and/or a wire bonding process for first and second surfaces (e.g., top and bottom surfaces) of a lead frame can be sequentially performed in one apparatus. Thus, packaging process time may decrease and yield may be increased.

Although the present general inventive concept has been described in connection with the embodiment of the present invention illustrated in the accompanying drawings, it is not limited thereto. It will be apparent to those skilled in the art that various substitutions, modifications and changes may be made without departing from the scope and spirit of the general inventive concept.

What is claimed is:

1. An apparatus to manufacture a semiconductor package, comprising:
   a first process unit to perform a semiconductor package manufacturing process on a first surface of a substrate;
   a reversing unit to reverse an orientation of the substrate such that a second surface of the substrate faces in a first direction towards the first process unit;
   a second process unit to perform a semiconductor package manufacturing process on the second surface of the substrate that faces in the first direction;
   a buffer part disposed adjacent to the second process unit to hold the processed substrate,
   wherein the first process unit, the reversing unit, and the second process unit are disposed inside an equipment housing.

2. The apparatus of claim 1, wherein the first process unit, the reversing unit, and the second process unit are arranged in a row and each include a transfer member for transferring the substrate in one direction, and wherein the transfer member includes:
   a guide rail aligned to extend in a transfer direction of the substrate and supporting the edge of the substrate; and
   a pusher to push the substrate supported by the guide rail in the transfer direction.

3. The apparatus of claim 2, wherein the reversing unit includes:
   a rotation driving member to rotate the guide rail to reverse the orientation of the first and second surfaces of the substrate supported by the guide rail.

4. The apparatus of claim 3, wherein the rotation driving member includes:
   a rotation shaft coupled with a side surface of the guide rail to be perpendicular to a longitudinal direction of the guide rail; and
   a driving motor to supply rotation force to the rotation shaft.

5. The apparatus of claim 4, wherein the substrate is a strip-type lead frame on which a plurality of semiconductor chips are mounted.

6. The apparatus of claim 1, wherein the first and second process units are a die attaching unit to attach a semiconductor chip to the first and second surfaces of the substrate.

7. The apparatus of claim 1, wherein the first and second process units are a wire bonding unit to electrically connect semiconductor chips attached to the first and second surfaces of the substrate to terminals of the substrate.

8. An apparatus to manufacture a semiconductor package, comprising:
   a die attaching part to attach a semiconductor chip to a substrate;
   a buffer part disposed adjacent to the die attaching part that includes a space to hold the substrate transferred from the die attaching part; and
   a wire bonding part disposed adjacent to the buffer part to electrically connect the semiconductor chips attached to the substrate transferred from the buffer part to terminals of the substrate,
   wherein the die attaching part includes first and second die attaching units to attach the semiconductor chip to a surface of the substrate that faces in a first direction, wherein the wire bonding part includes first and second wire bonding units to electrically connect the semiconductor chips attached to the surface of the substrate that faces in the first direction to terminals of the substrate, and wherein reversing units to reverse an orientation of the substrate are disposed between the first and second die attaching units and between the first and second wire bonding units, respectively.

9. The apparatus of claim 8, wherein the first and second die attaching units, the first and second wire bonding units, and the reversing units each include a transfer member for transferring the substrate in one direction, and wherein the transfer member includes:

a guide rail aligned to extend a transfer direction of the substrate and to support the edge of the substrate; and a pusher to push the substrate supported by the guide rail to the transfer direction.

10. The apparatus of claim 9, wherein each of the reversing units includes:

a rotation driving member to rotate the guide rail to reverse an orientation of a first surface and a second surface of the substrate supported by the guide rail.

11. The apparatus of claim 10, wherein the rotation driving member includes:

a rotation shaft coupled with a side surface of the guide rail to be perpendicular to a longitudinal direction of the guide rail; and a driving motor to supply rotation force to the rotation shaft.

12. The apparatus of claim 11, wherein the substrate is a strip-type lead frame on which a plurality of semiconductor chips are mounted.

13. The apparatus of claim 8, wherein the buffer part includes:

a guide rail aligned to extend in a transfer direction of the substrate and to support the edge of the substrate;

a rotation shaft coupled with a side surface of the guide rail to be perpendicular to a longitudinal direction of the guide rail; and a driving motor for supplying rotation force to the rotation shaft to reverse the orientation of a first surface and a second surface of the substrate supported by the guide rail.

* * * * *